US010410901B2

(12) United States Patent
Furuta et al.

(10) Patent No.: US 10,410,901 B2
(45) Date of Patent: Sep. 10, 2019

(54) ELECTROSTATIC CHUCK TABLE USING METHOD

(71) Applicant: DISCO CORPORATION, Tokyo (JP)

(72) Inventors: Kenji Furuta, Tokyo (JP); Yuriko Sato, Tokyo (JP); Sakae Matsuzaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/905,126

(22) Filed: Feb. 26, 2018

(65) Prior Publication Data

US 2018/0247853 A1 Aug. 30, 2018

(30) Foreign Application Priority Data

Feb. 27, 2017 (JP) .................. 2017-035316

(51) Int. Cl.
*H01L 21/78* (2006.01)
*H01L 21/683* (2006.01)
*B23K 26/53* (2014.01)
*B81C 99/00* (2010.01)
*B23K 26/00* (2014.01)
*B23K 26/035* (2014.01)
*B23K 103/00* (2006.01)

(52) U.S. Cl.
CPC ........ *H01L 21/6833* (2013.01); *B23K 26/009* (2013.01); *B23K 26/037* (2015.10); *B23K 26/53* (2015.10); *B81C 99/001* (2013.01); *B23K 2103/56* (2018.08)

(58) Field of Classification Search
CPC ..... H01L 21/6833; H01L 21/00; H01L 21/30; H01L 21/302; H01L 21/78; H01L 21/782; H01L 21/76; H01L 21/48; H01L 21/46; B23K 26/53; B23K 26/009; B23K 26/037; B23K 2103/56; B81C 99/001
USPC .......................................... 438/795
See application file for complete search history.

(56) References Cited

U.S. PATENT DOCUMENTS

2010/0003805 A1* 1/2010 Arai ................. H01L 21/78
438/460
2013/0122619 A1* 5/2013 Aikawa ............ H01L 33/0095
257/E33.06

(Continued)

FOREIGN PATENT DOCUMENTS

JP 2002192370 A 7/2002
JP 2012190977 A 10/2012

*Primary Examiner* — Chuong A Luu
(74) *Attorney, Agent, or Firm* — Greer Burns & Crain, Ltd.

(57) ABSTRACT

An electrostatic chuck table includes a plate-shaped base portion capable of transmitting a laser beam to be applied to a workpiece and an electrostatic attraction electrode portion capable of transmitting the laser beam. The laser beam has a transmission wavelength to the workpiece. The base portion has a first surface and a second surface opposite to the first surface. The electrode portion is formed on the first surface of the base portion. A method for using the electrostatic chuck table includes a workpiece holding step of applying a voltage to the electrode portion formed on the first surface to thereby electrostatically hold the workpiece on the second surface, and a modified layer forming step of applying the laser beam through the first surface to a predetermined position inside the workpiece held on the second surface to thereby form a modified layer inside the workpiece.

5 Claims, 6 Drawing Sheets

(56) References Cited

U.S. PATENT DOCUMENTS

2018/0004091 A1\* 1/2018 Shinoda ................ G03F 7/0002
2018/0019168 A1\* 1/2018 Matsuzaki .......... H01L 21/6831

\* cited by examiner

ELECTROSTATIC CHUCK TABLE USING METHOD

BACKGROUND OF THE INVENTION

Field of the Invention

The present invention relates to a using method for an electrostatic chuck table capable of transmitting a laser beam.

Description of the Related Art

Conventionally known is a processing method using a laser processing apparatus for forming a modified layer inside a wafer having semiconductor devices or optical devices such as LEDs (light emitting diodes) and then dividing the wafer along the modified layer as a break start point (see Japanese Patent No. 3408805, for example).

As compared with a dicing method using a cutting blade for cutting a wafer as supplying a cutting water to the cutting blade, the above processing method described in Japanese Patent No. 3408805 is very useful for a wafer having narrower streets because the kerf width (kerf loss) along each street can be made very small. Further, in this processing method, a mechanical shock to the workpiece can be greatly reduced, so that this processing method is very useful for the division of a wafer having minute structures called MEMS (micro electro mechanical systems) because the wafer can be divided without breaking the MEMS.

However, the laser beam has a wavelength such that it can be transmitted through the wafer and cannot be transmitted through a metal layer forming the circuits of the devices. Accordingly, in the processing method described in Japanese Patent No. 3408805, the following measures are required. That is, the front side of the wafer where the devices are formed is held on a holding surface so that the laser beam is applied to the back side of the wafer where the metal layer is not formed. As another measure, a special design is provided on the front side of the wafer in such a manner that a TEG pattern (test element group pattern) is not formed on each division line. As still another measure, a step of previously removing a TEG pattern formed on each division line is performed.

To eliminate these requirements, there has been proposed a laser processing apparatus using a chuck table capable of transmitting a laser beam, in which the laser beam is applied through the chuck table to the back side of the wafer where no pattern is formed (see Japanese Patent No. 5860219, for example).

SUMMARY OF THE INVENTION

However, in the laser processing apparatus described in Japanese Patent No. 5860219, a circuit (vacuum line) for applying a vacuum to the holding surface of the chuck table must be formed inside the chuck table. Further, since the refractive index of the vacuum line in the chuck table is different from the refractive index of the other portion of the chuck table, the laser beam must be applied through the chuck table in the area where the vacuum line is not formed. Thus, there is a limit in processing the workpiece by using this laser processing apparatus.

It is therefore an object of the present invention to provide an electrostatic chuck table using method which can suppress any limit in processing a workpiece.

In accordance with an aspect of the present invention, there is provided an electrostatic chuck table using method for using an electrostatic chuck table including a plate-shaped base portion capable of transmitting a laser beam to be applied to a workpiece, the laser beam having a transmission wavelength to the workpiece, the base portion having a first surface and a second surface opposite to the first surface, and an electrostatic attraction electrode portion capable of transmitting the laser beam, the electrode portion being formed on the first surface of the base portion, the electrostatic chuck table using method including a workpiece holding step of applying a voltage to the electrode portion formed on the first surface to thereby electrostatically hold the workpiece on the second surface; and a modified layer forming step of applying the laser beam through the first surface to a predetermined position inside the workpiece held on the second surface to thereby form a modified layer inside the workpiece.

Preferably, the transmission wavelength of the laser beam is set in the range of 500 to 1400 nm. Preferably, the workpiece includes a wafer having a front side where MEMS devices are formed and a back side to be held on the second surface of the electrostatic chuck table.

According to the electrostatic chuck table using method of the present invention, it is possible to exhibit an effect that any limit in processing the workpiece can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
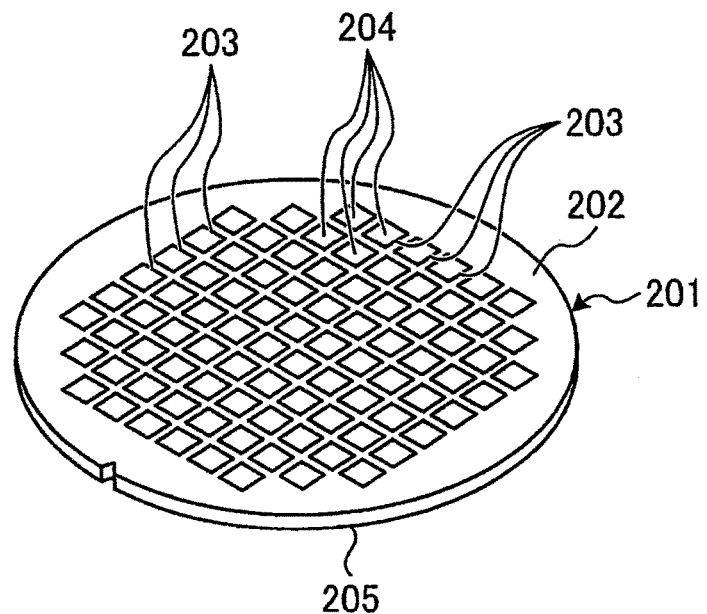
FIG. 1 is a perspective view of a workpiece to be held on an electrostatic chuck table in an electrostatic chuck table using method according to a preferred embodiment of the present invention.
Figure 2:
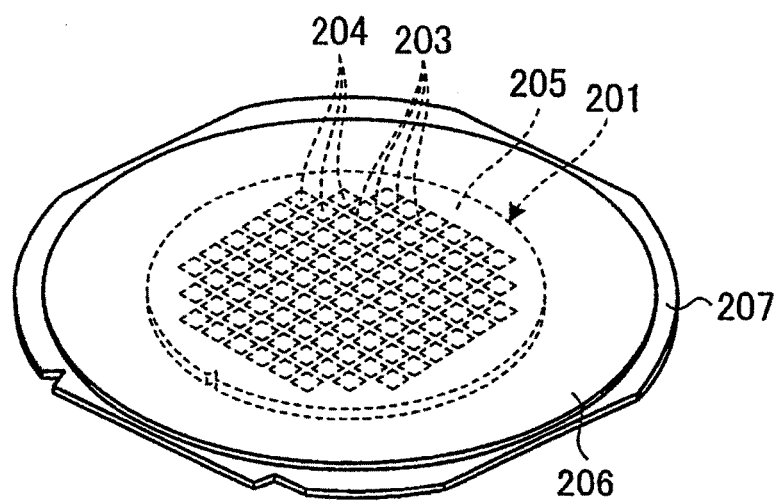
FIG. 2 is a perspective view showing a condition that the workpiece shown in FIG. 1 is supported through an adhesive tape to an annular frame.

There will now be described an electrostatic chuck table using method according to a preferred embodiment of the present invention with reference to the drawings. FIG. 1 is a perspective view of a workpiece 201 to be held on an electrostatic chuck table in the electrostatic chuck table using method according to this preferred embodiment. FIG. 2 is a perspective view showing a condition that the workpiece 201 shown in FIG. 1 is supported through an adhesive tape 206 to an annular frame 207.

The electrostatic chuck table using method according to this preferred embodiment is also a processing method for the workpiece 201 shown in FIG. 1. The workpiece 201 shown in FIG. 1 is a disk-shaped semiconductor wafer or optical device wafer formed of silicon, sapphire, or gallium arsenide, for example, as a base material. As shown in FIG. 1, the workpiece 201 is a plate-shaped member having a front side 202 and a back side 205 opposite to the front side 202. A plurality of crossing division lines 203 are formed on the front side 202 of the workpiece 201 to define a plurality of separate regions where a plurality of devices 204 are formed. Examples of each device 204 includes IC (integrated circuit), LSI (large-scale integrated circuit), and MEMS (micro electro mechanical systems) device. Thus, the devices 204 such as ICs, LSIs, and MEMS devices are formed on the front side 202 of the workpiece 201 so as to be separated by the crossing division lines 203.

As shown in FIG. 2, the adhesive tape 206 is attached at its central portion to the back side 205 of the workpiece 201, and the peripheral portion of the adhesive tape 206 is attached to the annular frame 207 having an inside opening. Accordingly, the workpiece 201 is supported through the adhesive tape 206 to the annular frame 207 in the condition where the workpiece 201 is located in the inside opening of the annular frame 207. The adhesive tape 206 can transmit a laser beam 300 (see FIG. 10) to be applied by a laser processing apparatus 10 (see FIG. 3). The processing method for the workpiece 201 is performed in the condition where the workpiece 201 is supported through the adhesive tape 206 to the annular frame 207, thereby dividing the workpiece 201 into individual device chips corresponding to the devices 204. In this preferred embodiment, MEMS devices are formed as the devices 204 on the front side 202 of the workpiece 201. However, the devices 204 are not limited to MEMS devices. Further, in the case that the devices 204 are ICs or LSIs, each device 204 preferably has bumps or chips on the front side or preferably has asperities on the front side.

Figure 3:
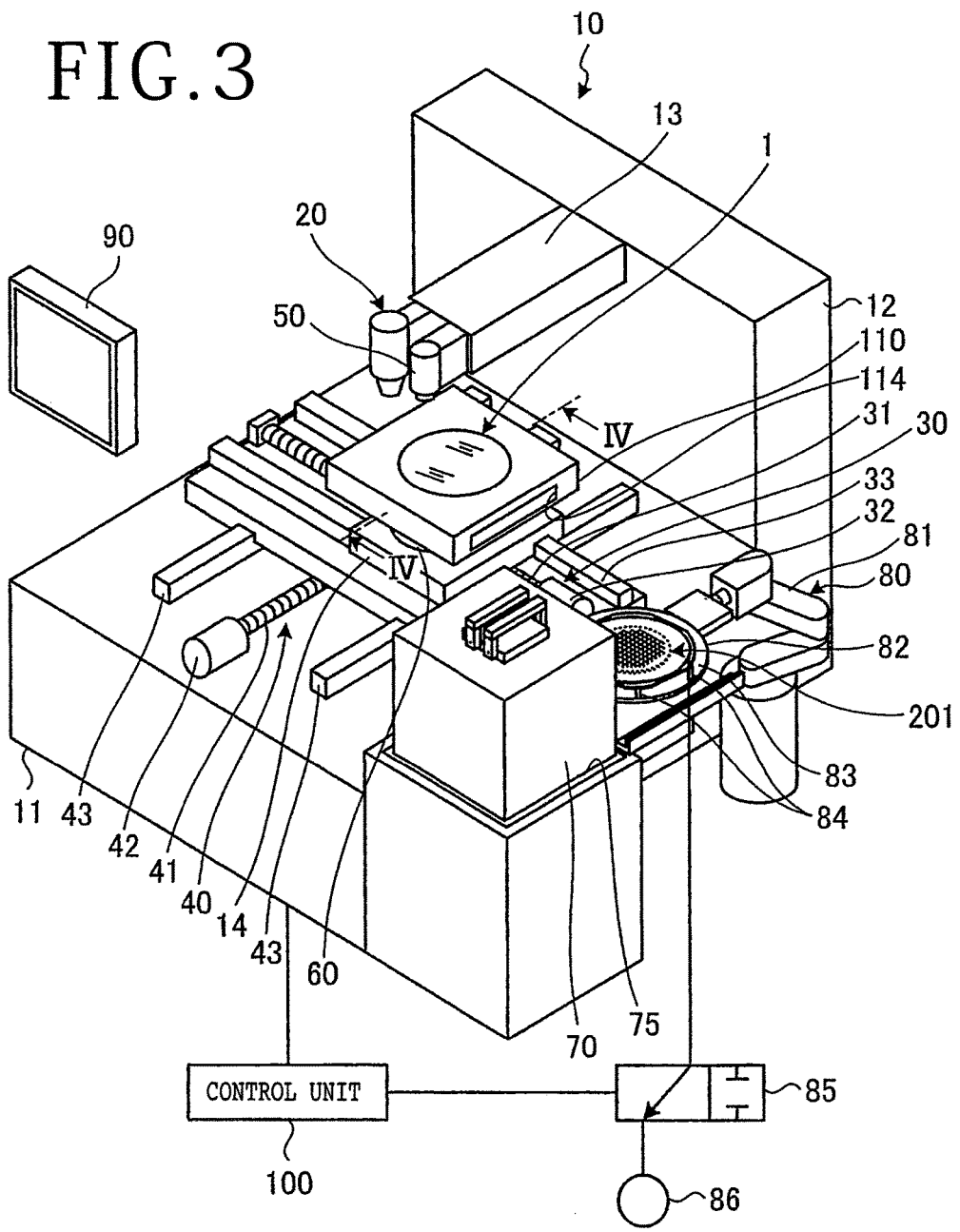
FIG. 3 is a perspective view of a laser processing apparatus for performing the electrostatic chuck table using method according to this preferred embodiment.
Figure 4:
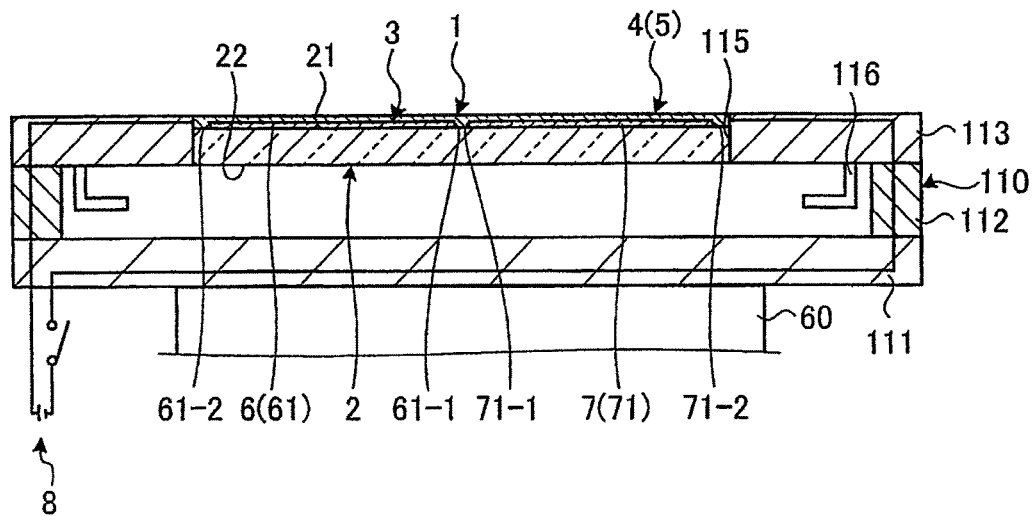
FIG. 4 is a cross section taken along the line IV-IV in FIG. 3.
Figure 5:
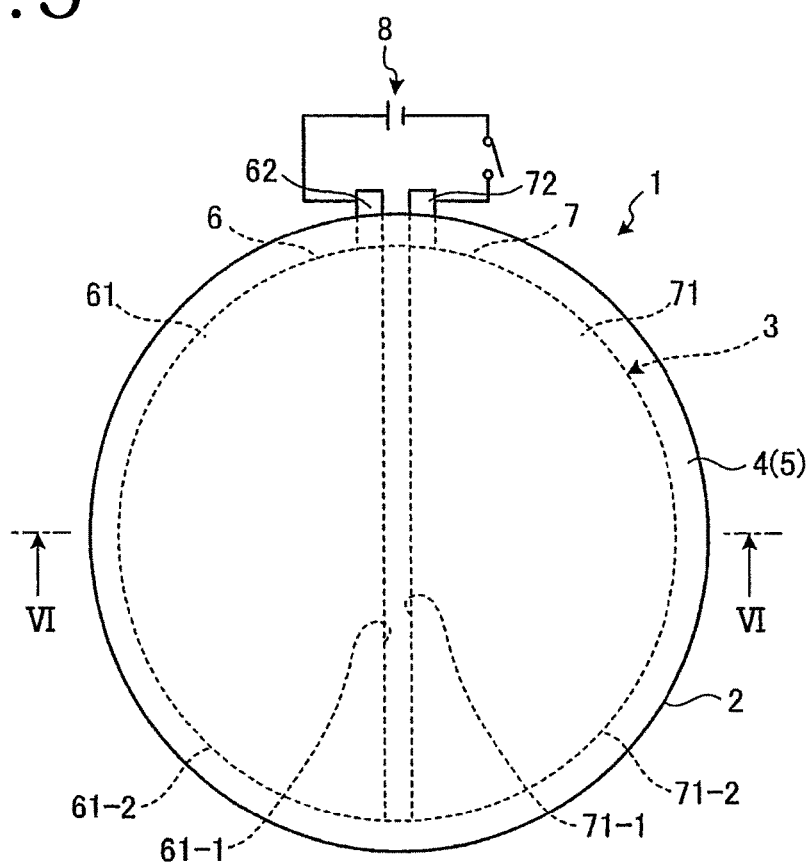
FIG. 5 is a plan view of an electrostatic chuck table included in the laser processing apparatus shown in FIG. 3.
Figure 6:
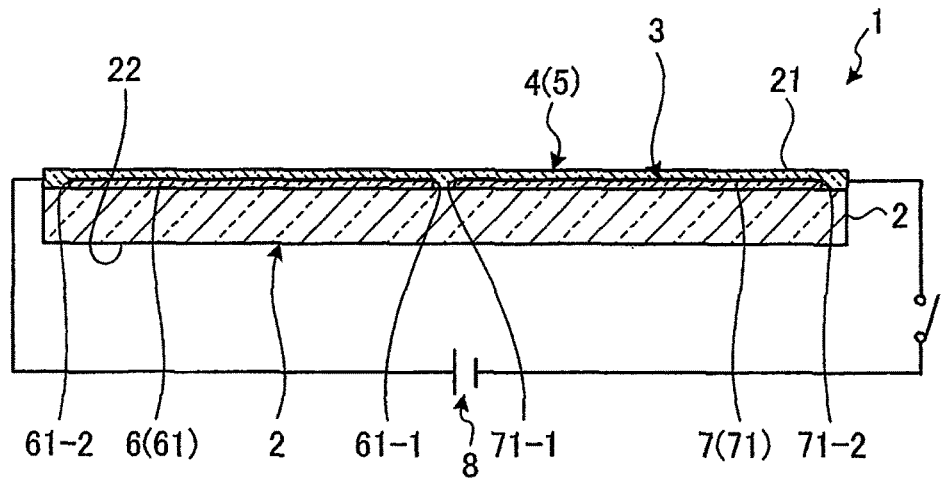
FIG. 6 is a cross section taken along the line VI-VI in FIG. 5.
Figure 7:
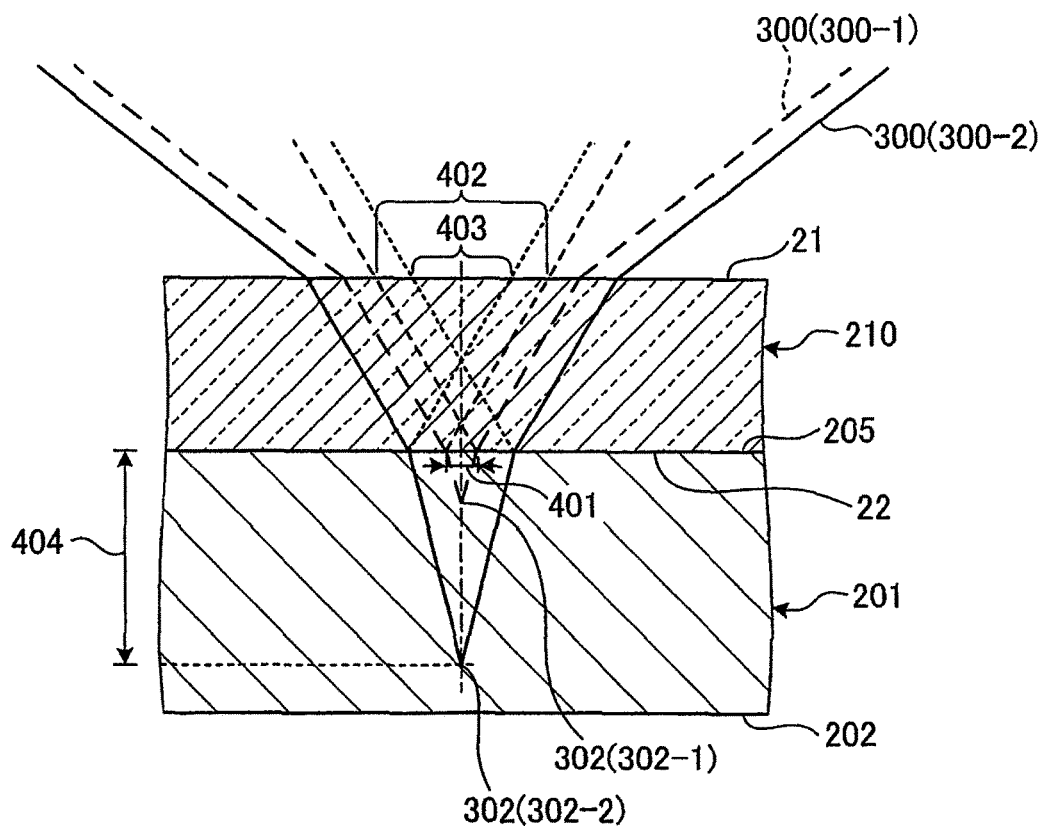
FIG. 7 is an enlarged sectional view of an essential part of the electrostatic chuck table shown in FIG. 5.

The electrostatic chuck table using method according to this preferred embodiment, i.e., the processing method for the workpiece 201 is performed by the laser processing apparatus 10 shown in FIG. 3. The configuration of the laser processing apparatus 10 will now be described with reference to FIGS. 3 to 7. FIG. 3 is a perspective view of the laser processing apparatus 10 for performing the electrostatic chuck table using method according to this preferred embodiment. FIG. 4 is a cross section taken along the line IV-IV in FIG. 3. FIG. 5 is a plan view of an electrostatic chuck table 1 included in the laser processing apparatus 10 shown in FIG. 3. FIG. 6 is a cross section taken along the line VI-VI in FIG. 5. FIG. 7 is an enlarged sectional view of an essential part of the electrostatic chuck table 1 shown in FIG. 5.

The laser processing apparatus 10 is an apparatus for applying a laser beam 300 (see FIG. 10) having a transmission wavelength to the workpiece 201, from the back side 205 of the workpiece 201 along each division line 203 to thereby form a modified layer 301 (see FIG. 10) as a break start point inside the workpiece 201 along each division line 203. The modified layer 301 means a region where physical properties such as density, refractive index, and mechanical strength are different from those in its surrounding region. Examples of such a region include a melted region, cracked region, dielectric breakdown region, refractive index changed region, and mixture thereof.

As shown in FIG. 3, the laser processing apparatus 10 includes a disk-shaped electrostatic chuck table 1 as a chuck table for holding the workpiece 201, a laser beam applying unit 20 as a processing unit, an X moving unit 30 for relatively moving the electrostatic chuck table 1 and the laser beam applying unit 20 in the X direction shown by an arrow X, a Y moving unit 40 for relatively moving the electrostatic chuck table 1 and the laser beam applying unit 20 in the Y direction shown by an arrow Y, an imaging unit 50 for imaging the workpiece 201, and a control unit 100 for controlling these components. The X direction and the Y direction are perpendicular to each other in a horizontal plane.

The laser beam applying unit 20 is a unit for applying a laser beam 300 having a predetermined transmission wavelength to the workpiece 201, from the back side 205 of the workpiece 201 held on the electrostatic chuck table 1. The laser beam applying unit 20 is a unit for forming a modified layer 301 inside the workpiece 201 by applying the laser beam 300. The wavelength of the laser beam 300 to be applied by the laser beam applying unit 20 is set in the range of 500 to 1400 nm. The laser processing apparatus 10 has a base housing 11, a rear wall 12 vertically extending from the base housing 11 at its rear end, and a support arm 13 horizontally extending from the front surface of the rear wall 12 at its upper end. The laser beam applying unit 20 is mounted on the front end of the support arm 13. The laser beam applying unit 20 includes oscillating means (not shown) for oscillating the laser beam 300 and focusing means (not shown) for focusing the laser beam 300 oscillated from the oscillating means. The oscillating means is so configured as to suitably adjust the frequency of the laser beam 300 according to the kind, processing form, etc. of the workpiece 201. The focusing means includes a total reflection mirror for changing the traveling direction of the laser beam 300 oscillated from the oscillating means and a focusing lens for focusing the laser beam 300 reflected by the total reflection mirror. The focusing means is adapted to move the focal point 302 (see FIG. 10) of the laser beam 300 in the Z direction shown by an arrow Z. The Z direction is parallel to a vertical direction and perpendicular to both the X direction and the Y direction.

The X moving unit 30 is feeding means for moving the electrostatic chuck table 1 in the X direction to thereby feed the electrostatic chuck table 1 in the X direction, which is parallel to both a horizontal direction and the lateral direction of the base housing 11. The Y moving unit 40 is indexing means for moving the electrostatic chuck table 1 in the Y direction to thereby index the electrostatic chuck table 1 in the Y direction, which is parallel to a horizontal direction and perpendicular to the X direction. The X moving unit 30 includes a known ball screw 31 rotatable about its axis extending in the X direction, a known pulse motor 32 for rotating the ball screw 31, and a pair of known guide rails 33 for movably supporting the electrostatic chuck table 1 so as to allow the movement of the electrostatic chuck table 1 in the X direction. Similarly, the Y moving unit 40 includes a known ball screw 41 rotatable about its axis extending in the Y direction, a known pulse motor 42 for rotating the ball screw 41, and a pair of known guide rails 43 for movably supporting the electrostatic chuck table 1 so as to allow the movement of the electrostatic chuck table 1 in the Y direction. The laser processing apparatus 10 further includes a rotational drive source 60 for rotating the electrostatic chuck table 1 about its axis extending in the Z direction parallel to both the X direction and the Y direction. The rotational drive source 60 is provided on a moving table 14 movable in the X direction by the X moving unit 30.

The imaging unit 50 functions to image the workpiece 201 held on the electrostatic chuck table 1. The imaging unit 50 is mounted on the front end of the support arm 13 so as to be juxtaposed to the laser beam applying unit 20 in the X direction. The imaging unit 50 is configured by a CCD (charge coupled device) or infrared camera for imaging the workpiece 201 held on the electrostatic chuck table 1.

The laser processing apparatus 10 further includes a cassette 70 for storing a plurality of workpieces 201 before and after processing, a cassette elevator 75 for removably placing the cassette 70 on the upper surface and vertically moving the cassette 70, a transfer unit 80 for taking one of the plural workpieces 201 out of the cassette 70 before processing and returning the workpiece 201 to the cassette 70 after processing, and a touch panel 90 for displaying information and also allowing the input of various information for processing.

The cassette 70 is a container capable of storing a plurality of workpieces 201 in the condition where each workpiece 201 is supported through the adhesive tape 206 to the annular frame 207. In the cassette 70, the front side 202 of each workpiece 201 is oriented upward. The cassette elevator 75 is vertically movable in the Z direction.

The transfer unit 80 has a function of taking one of the plural workpieces 201 out of the cassette 70 before processing and then transferring the workpiece 201 to the electrostatic chuck table 1 and also has a function of transferring the workpiece 201 from the electrostatic chuck table 1 to the cassette 70 after processing. The transfer unit 80 includes a movable arm 81 having a plurality of joints and a holding portion 82 provided at the front end of the movable arm 81 for holding the workpiece 201.

The holding portion 82 includes a C-shaped plate-shaped body portion 83 and a plurality of suction pads 84 provided on the body portion 83 for holding under suction the annular frame 207 surrounding the workpiece 201. These suction pads 84 are provided on the lower surface of the body portion 83 so as to be opposed to the upper surface of the annular frame 207 supporting each workpiece 201 stored in the cassette 70. Each suction pad 84 is connected through a selector valve 85 to a vacuum source 86. Thus, the upper surface of the annular frame 207 supporting each workpiece 201 stored in the cassette 70 is adapted to be held under suction by the suction pads 84 provided on the lower surface of the body portion 83 of the holding portion 82 constituting the transfer unit 80. Accordingly, each workpiece 201 stored in the cassette 70 can be held by the holding portion 82 without the contact therewith in such a manner that each workpiece 201 is exposed to an inside opening formed inside the C-shaped body portion 83. After taking one of the workpieces 201 out of the cassette 70, the holding portion 82 is inverted to thereby invert the workpiece 201, so that the adhesive tape 206 attached to the back side 205 of the workpiece 201 is oriented upward. Thereafter, the workpiece 201 is transferred to the electrostatic chuck table 1 by the holding portion 82 of the transfer unit 80, and the adhesive tape 206 is adapted to abut against the lower surface of the electrostatic chuck table 1, and the workpiece 201 is electrostatically held through the adhesive tape 206 on the lower surface of the electrostatic chuck table 1. Conversely, in the case of transferring the workpiece 201 from the electrostatic chuck table 1 to the cassette 70 after processing, the transfer unit 80 is operated to hold the workpiece 201 by applying the suction pads 84 to the annular frame 207. After the workpiece 201 is separated from the electrostatic chuck table 1, the holding portion 82 holding the workpiece 201 is inverted to invert the workpiece 201, so that the front side 202 of the workpiece 201 is oriented upward. Thereafter, the workpiece 201 supported through the adhesive tape 206 to the annular frame 207 is stored again into the cassette 70 by the transfer unit 80.

The touch panel 90 includes a liquid crystal display for displaying an operational condition, image, etc. and a touch screen superimposed on the liquid crystal display. The touch screen is adapted to detect the contact or proximity of a finger, pen, or stylus pen. That is, the touch screen is adapted to detect a position on the liquid crystal display where a finger, pen, or stylus pen has come into contact or proximity. The touch screen may adopt any detection method such as an electrostatic capacity method, resistance film method, surface acoustic method, ultrasonic method, infrared method, electromagnetic induction method, and load detection method.

The electrostatic chuck table 1 is a chuck table for electrostatically holding the workpiece 201 in applying the laser beam 300 to the workpiece 201 to form the modified layer 301 inside the workpiece 201 along each division line 203. As shown in FIG. 4, the electrostatic chuck table 1 is supported through a workpiece storing case 110 to the rotational drive source 60. The workpiece storing case 110 is a flattened rectangular case and it is mounted on the rotational drive source 60. The workpiece storing case 110 is adapted to store the workpiece 201 supported through the adhesive tape 206 to the annular frame 207 in the condition where the front side 202 of the workpiece 201 is oriented downward. The workpiece storing case 110 includes a bottom member 111 mounted on the rotational drive source 60, a side wall member 112 mounted on the upper surface of the bottom member 111 along the peripheral edge thereof, and a top member 113 mounted on the upper end of the side wall member 112. As shown in FIG. 3, the side wall member 112 is formed with an inlet/outlet opening 114 for allowing the pass of the workpiece 201 held by the holding portion 82 of the transfer unit 80. The top member 113 is so configured as to support the electrostatic chuck table 1 at the central position. More specifically, the top member 113 has a circular hole 115 at the central position, and the outer circumference of the circular electrostatic chuck table 1 is mounted on the inner circumference of the top member 113 forming the circular hole 115. Further, a plurality of frame clamps 116 for clamping the annular frame 207 are provided inside the workpiece storing case 110.

As shown in FIGS. 5 and 6, the electrostatic chuck table 1 includes a plate-shaped base portion 2 capable of transmitting the laser beam 300, an electrostatic attraction electrode portion 3 capable of transmitting the laser beam 300, and a resin layer 4 capable of transmitting the laser beam 300. The electrode portion 3 is formed on the upper surface of the base portion 2, and the resin layer 4 is formed so as to cover the electrode portion 3. The base portion 2 is formed of silica glass, for example. The base portion 2 is a disk-shaped member having a first surface 21 as an upper surface or outside surface as shown in FIG. 4 and a second surface 22 as a lower surface or inside surface as shown in FIG. 4. The second surface 22 is opposite to the first surface 21. The base portion 2 has a thickness of 1 mm, for example. However, the thickness of the base portion 2 is not limited to 1 mm.

As shown in FIGS. 4 and 6, the electrode portion 3 is stacked on the first surface 21 of the base portion 2. The electrode portion 3 is formed of indium tin oxide (ITO), for example.

The electrode portion 3 includes a positive electrode 6 and a negative electrode 7. The positive electrode 6 and the negative electrode 7 are electrically insulated from each other. The positive electrode 6 includes a holding portion 61 and a terminal portion 62. Similarly, the negative electrode 7 includes a holding portion 71 and a terminal portion 72. The holding portion 61 and the holding portion 71 are both semicircular in plan as shown in FIG. 5 and they have the same size. Both the holding portions 61 and 71 are stacked on the first surface 21 of the base portion 2.

The periphery of the semicircular holding portion 61 includes a straight portion 61-1 and an arcuate portion 61-2 connected at its opposite ends to the opposite ends of the straight portion 61-1. Similarly, the periphery of the semi-circular holding portion 71 includes a straight portion 71-1 and an arcuate portion 71-2 connected at its opposite ends to the opposite ends of the straight portion 71-1. The straight portions 61-1 and 71-1 are parallel to each other and spaced from each other. The arcuate portions 61-2 and 71-2 extend along the outer circumference of the base portion 2 in the vicinity thereof. Thus, the holding portion 61 of the positive electrode 6 and the holding portion 71 of the negative electrode 7 are stacked on almost all of the first surface 21 of the base portion 2 in such a manner that the straight portions 61-1 and 71-1 are spaced a small distance from each other and the arcuate portions 61-2 and 71-2 extend along the outer circumference of the base portion 2 in the vicinity thereof. Further, the space between the straight portions 61-1 and 71-1, the space between the arcuate portion 61-2 and the outer circumference of the base portion 2, and the space between the arcuate portion 71-2 and the outer circumference of the base portion 2 are filled with a UV (ultraviolet) adhesive 5 to form a part of the resin layer 4. Further, the holding portions 61 and 71 are fully covered with the UV adhesive 5 to form the resin layer 4. That is, the resin layer 4 is formed of the UV adhesive 5. The UV adhesive 5 is an ultraviolet curable resin capable of transmitting the laser beam 300.

The terminal portion 62 extends radially outward from the periphery of the holding portion 61 and projects from the outer circumference of the base portion 2. Similarly, the terminal portion 72 extends radially outward from the periphery of the holding portion 71 and projects from the outer circumference of the base portion 2. Both the terminal portions 62 and 72 are connected to a power source 8. In holding the workpiece 201 on the electrostatic chuck table 1, a positive voltage is applied from the power source 8 to the terminal portion 62 of the positive electrode 6, and a negative voltage is applied from the power source 8 to the terminal portion 72 of the negative electrode 7.

The resin layer 4 is formed so as to fully cover the electrode portion 3. The resin layer 4 is formed of the UV adhesive 5. The UV adhesive 5 is curable by the irradiation with ultraviolet light. The UV adhesive 5 has an insulating property. For example, Norland Optical Adhesive manufactured by Norland Products, Inc. in USA may be used as the UV adhesive 5. However, the UV adhesive 5 is not limited to this adhesive. The refractive index of the UV adhesive 5 cured, that is, the resin layer 4, is substantially equal to the refractive index of indium tin oxide forming the electrode portion 3. The wording of "the refractive index is substantially equal" means that the refractive index is equal and that the refractive index is different to such an extent that the modified layer 301 can be formed at a desired position by the laser beam 300.

In holding the workpiece 201 on the electrostatic chuck table 1, the workpiece 201 is brought into abutment through the adhesive tape 206 against the second surface 22 of the base portion 2. In this condition, a positive voltage is applied from the terminal portion 62 to the holding portion 61 of the positive electrode 6, and a negative voltage is applied from the terminal portion 72 to the holding portion 71 of the negative electrode 7. As a result, an electrostatic attraction force is generated between the holding portions 61 and 71 to thereby electrostatically hold the workpiece 201 to the second surface 22.

The control unit 100 functions to control the components of the laser processing apparatus 10 in the operation of forming the modified layer 301 in the workpiece 201. The control unit 200 includes a computer system. That is, the control unit 100 includes a computing section having a microprocessor such as CPU (central processing unit), a storage section having a memory such as ROM (read only memory) and RAM (random access memory), and an input/output interface section.

The computing section of the control unit 100 functions to compute according to a computer program stored in the storage section and then output a control signal through the input/output interface section to each component of the laser processing apparatus 10, thereby controlling the laser processing apparatus 10. The control unit 100 is connected to the touch panel 90 and the selector valve 85.

There will now be described the conditions to be set in applying the laser beam 300 through the electrostatic chuck table 1 to the workpiece 201 with reference to FIG. 7. In FIG. 7, the adhesive tape 206 is not shown. As shown in FIG. 7, the control unit 100 controls the laser beam applying unit 20 to set the focal point 302 of the laser beam 300 inside the workpiece 201. In FIG. 7, reference numeral 210 denotes a light transmitting member including the base portion 2 and the adhesive tape 206. When the laser beam 300 is applied from the laser beam applying unit 20 through the electrostatic chuck table 1 to the workpiece 201, the laser beam 300 is refracted on the first surface 21 and the second surface 22 of the base portion 2 and partially reflected on the second surface 22.

In the case that the focal point 302 (302-1) of the laser beam 300 (300-1) is set at a shallow depth near the second surface 22, i.e., near the back side 205 of the workpiece 201 by the control unit 100, the laser beam 300 passes through the second surface 22 in a range 401 shown in FIG. 7 and enters the workpiece 201. At the same time, the laser beam 300 is partially reflected on the second surface 22 in this range 401 and then passes through the first surface 21 in a range 402 shown in FIG. 7. In this case, the energy density of the laser beam 300 in the range 402 is smaller than the energy density of the laser beam 300 in the range 401. Accordingly, it is possible to suppress the problem that the electrode portion 3 formed on the first surface 21 may be damaged by the laser beam 300. The energy density of the laser beam 300 in the range 402 is defined as a minimum threshold value for the energy density of the laser beam 300 at which the electrode portion 3 formed on the first surface 21 is not damaged.

In the case that the focal point 302 (302-2) of the laser beam 300 (300-2) is set at a deep depth far from the second surface 22, i.e., near the front side 202 of the workpiece 201 by the control unit 100, the laser beam 300 reflected on the second surface 22 passes through the first surface 21 in a range 403 shown in FIG. 7. In this case, the control unit 100 controls the position of the focal point 302 (302-2) of the laser beam 300 or lowers the power of the laser beam 300 so that the energy density of the laser beam 300 in the range 403 becomes smaller than the energy density of the laser beam 300 in the range 402. That is, the control unit 100 in the laser processing apparatus 10 sets the focal point 302 (302-2) of the laser beam 300 at a depth 404 or less (the depth from the back side 205 of the workpiece 201) where the energy density of the laser beam 300 in the range 403 is smaller than the energy density of the laser beam 300 in the range 402.

Figure 8:
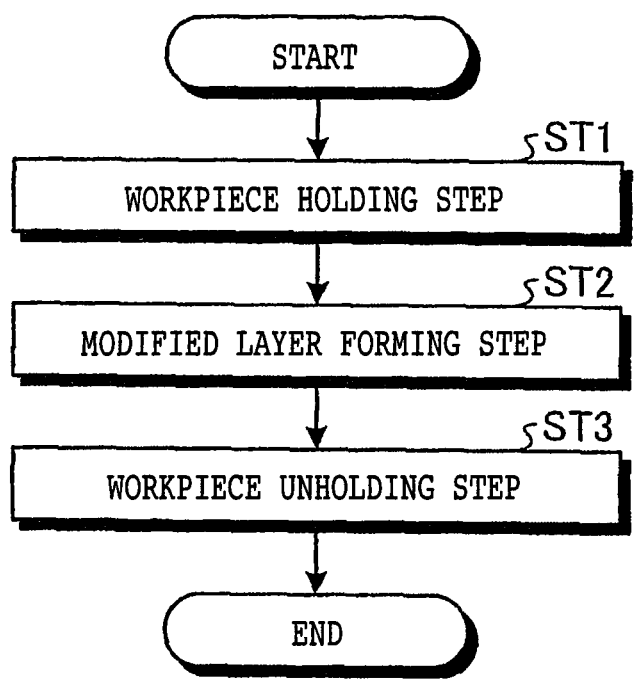
FIG. 8 is a flowchart showing the electrostatic chuck table using method according to this preferred embodiment.
Figure 9:
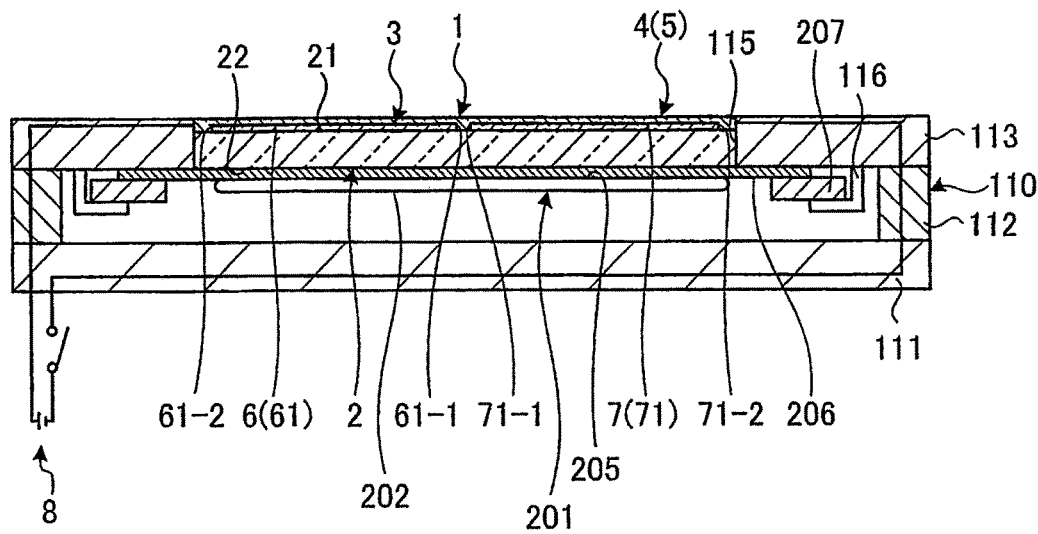
FIG. 9 is a sectional view showing a workpiece holding step in the electrostatic chuck table using method according to this preferred embodiment.
Figure 10:
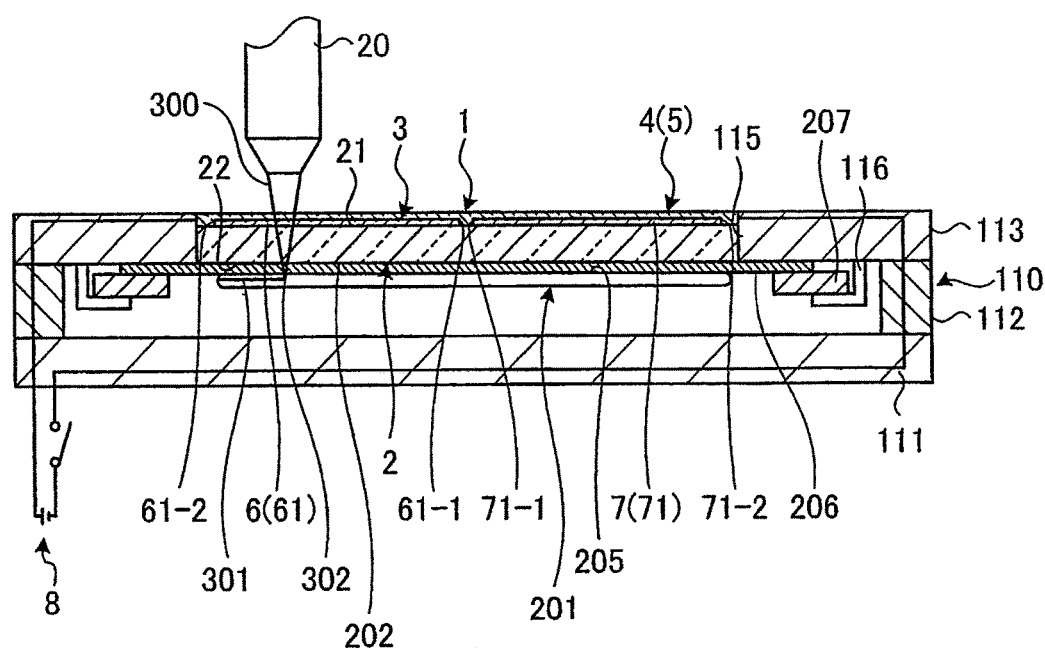
FIG. 10 is a sectional view showing a modified layer forming step in the electrostatic chuck table using method according to this preferred embodiment.

There will now be described the electrostatic chuck table using method, or the processing method for the workpiece 201 by the use of the laser processing apparatus 10, with reference to the drawings including FIGS. 8 to 10. FIG. 8 is a flowchart showing the electrostatic chuck table using method according to this preferred embodiment. FIG. 9 is a sectional view showing a workpiece holding step in the electrostatic chuck table using method according to this preferred embodiment. FIG. 10 is a sectional view showing a modified layer forming step in the electrostatic chuck table using method according to this preferred embodiment.

Prior to starting the electrostatic chuck table using method, the information on processing is recorded into the control unit 100 of the laser processing apparatus 10 by an operator. When the operator instructs the control unit 100 to start the processing operation of the laser processing apparatus 10, the electrostatic chuck table using method is started by the control unit 100.

As shown in FIG. 8, the electrostatic chuck table using method (which will be hereinafter referred to simply as "using method") includes a workpiece holding step ST1, a modified layer forming step ST2, and a workpiece unholding step ST3. In the workpiece holding step ST1, the control unit 100 operates the selector valve 85 to apply a suction force from the vacuum source 86 to the suction pads 84 of the holding portion 82 of the transfer unit 80. The annular frame 207 supporting the workpiece 201 stored in the cassette 70 is held by the suction pads 84 under suction in the condition where the front side 202 of the workpiece 201 is oriented upward. Thereafter, the workpiece 201 is taken out of the cassette 70 by operating the transfer unit 80 and then inserted into the workpiece storing case 110. As shown in FIG. 9, the workpiece 201 is brought into abutment through the adhesive tape 206 against the second surface 22 of the base portion 2 of the electrostatic chuck table 1. In this condition, a positive voltage is applied to the terminal portion 62 of the positive electrode 6 of the electrode portion 3 formed on the first surface 21 of the base portion 2, and a negative voltage is applied to the terminal portion 72 of the negative electrode 7 of the electrode portion 3, thereby electrostatically holding the workpiece 201 on the second surface 22. Further, the annular frame 207 is clamped by the frame clamps 116. Thereafter, the selector valve 85 is operated to stop the application of the suction force from the vacuum source 86 to the suction pads 84. That is, suction holding by the suction pads 84 is canceled. Thereafter, the procedure proceeds to the modified layer forming step ST2.

In the modified layer forming step ST2, the control unit 100 controls the imaging unit 50 to image the workpiece 201 through the electrostatic chuck table 1 and then perform alignment according to the image of the workpiece 201. Thereafter, as shown in FIG. 10, the laser beam 300 is applied from the laser beam applying unit 20 through the electrostatic chuck table 1 and the adhesive tape 206 toward a target one of the division lines 203 of the workpiece 201 in the condition where the focal point 302 of the laser beam 300 is set inside the workpiece 201. At the same time, the electrostatic chuck table 1 is moved in the X direction by the X moving unit 30 to thereby apply the laser beam 300 along the target division line 203. Thereafter, the laser beam 300 is similarly applied along all of the other division lines 203 by controlling the X moving unit 30, the Y moving unit 40, and the rotational drive source 60. As a result, a plurality of modified layers 301 are formed inside the workpiece 201 along all the crossing division lines 203 in the condition where the workpiece 201 is electrostatically held through the adhesive tape 206 on the second surface 22 of the base portion 2 of the electrostatic chuck table 1. In this manner, the electrostatic chuck table 1 is used in applying the laser beam 300 through the first surface 21 to the workpiece 201 to form the modified layers 301 inside the workpiece 201 in the condition where the workpiece 201 is electrostatically held on the second surface 22 by applying a voltage to the electrode portion 3 formed on the first surface 21. Thereafter, the procedure proceeds to the workpiece unholding step ST3.

In the workpiece unholding step ST3, the control unit 100 controls the electrostatic chuck table 1 to cancel the electrostatic holding of the workpiece 201 and also controls the selector valve 85 to apply a suction force from the vacuum source 86 to the suction pads 84, thereby holding the lower surface of the annular frame 207 supporting the workpiece 201. Thereafter, the clamping by the frame clamps 116 is also canceled. Thereafter, the transfer unit 80 is operated to take the workpiece 201 out of the workpiece storing case 110. Thereafter, the holding portion 82 having the suction pads 84 is inverted to invert the workpiece 201 supported through the adhesive tape 206 to the annular frame 207. As a result, the workpiece 201 is held by the holding portion 82 in the condition where the front side 202 of the workpiece 201 is oriented upward. In this condition, the workpiece 201 is stored into the cassette 70 by the transfer unit 80. Thereafter, the suction holding by the suction pads 84 is canceled. In the next step, the workpiece 201 in which the modified layer 301 has been formed along each division line 203 is divided into individual device chips corresponding to the devices 204.

As described above, the base portion 2, the electrode portion 3, and the resin layer 4 of the electrostatic chuck table 1 can all transmit the laser beam 300 for processing the workpiece 201. Accordingly, the laser beam 300 can be applied through the electrostatic chuck table 1 to the workpiece 201 in the condition where the back side 205 of the workpiece 201 is held on the second surface 22 of the base portion 2 of the electrostatic chuck table 1, in which a metal layer and the devices 204 are not formed on the back side 205. That is, according to this electrostatic chuck table using method, it is unnecessary to hold the front side 202 of the workpiece 201, so that there is no possibility that the devices 204 each having surface asperities may be damaged. Further, it is unnecessary to provide a special design on the front side 202 of the workpiece 201 or to previously remove a TEG pattern from each division line. Accordingly, any limit in processing the workpiece 201 can be suppressed according to the electrostatic chuck table using method.

Further, the holding portion 61 of the positive electrode 6 and the holding portion 71 of the negative electrode 7 constituting the electrode portion 3 of the electrostatic chuck table 1 are both semicircular in plan and they are formed on almost all of the first surface 21 of the base portion 2. Accordingly, an electrostatic attraction force can be generated between the holding portion 61 of the positive electrode 6 and the holding portion 71 of the negative electrode 7, thereby electrostatically holding the workpiece 201. That is, the workpiece 201 can be electrostatically held on almost all of the second surface 22 of the base portion 2 by the electrostatic attraction force generated between the holding portions 61 and 71. Accordingly, as compared with the case of holding the peripheral portion of the workpiece 201 under suction, the workpiece 201 can be fully held on almost all of the second surface 22 of the base portion 2. Further, in the case of holding the peripheral portion of the workpiece 201 under suction, it is necessary to form a vacuum line or the like different in refractive index from the other area in a chuck table using a vacuum for holding a workpiece. To the contrary, such a vacuum line or the like is not necessary in the electrostatic chuck table 1 because the workpiece 201 can be held on almost all the second surface 22 by the electrostatic attraction force generated between the holding portions 61 and 71. Accordingly, the laser beam can be applied without consideration of such a vacuum line. That is, any limit in processing the workpiece 201 can be suppressed according to this electrostatic chuck table using method.

Further, the electrode portion 3 is formed on the first surface 21 opposite to the second surface 22 for holding the workpiece 201 in the electrostatic chuck table 1. Accordingly, the electrode portion 3 can be positioned away from the focal point 302 of the laser beam 300, thereby suppressing damage to the electrode portion 3 due to the laser beam 300. Thus, the workpiece 201 can be electrostatically held on almost all the second surface 22 of the base portion 2 as suppressing damage to the electrode portion 3 due to the laser beam 300.

Further, in the electrostatic chuck table 1, the refractive index of the indium tin oxide forming the electrode portion 3 is substantially equal to the refractive index of the UV adhesive 5 forming the resin layer 4 so as to fill the space between the straight portions 61-1 and 71-1. Accordingly, the modified layer 301 can be formed at a desired position in the workpiece 201.

According to this electrostatic chuck table using method, the following electrostatic chuck table can be obtained.

APPENDIX

An electrostatic chuck table for holding a workpiece in applying a laser beam having a transmission wavelength to the workpiece to thereby form a modified layer inside the workpiece, the electrostatic chuck table including a plate-shaped base portion capable of transmitting the laser beam, the base portion having a first surface and a second surface opposite to the first surface, and an electrostatic attraction electrode portion capable of transmitting the laser beam, the electrode portion being formed on the first surface of the base portion, in which the laser beam is applied through the first surface to a predetermined position inside the workpiece to thereby form the modified layer inside the workpiece in the condition where a voltage is applied to the electrode portion formed on the first surface to thereby electrostatically hold the workpiece on the second surface.

In the electrostatic chuck table described in Appendix, both the base portion and the electrode portion can transmit the laser beam. Accordingly, the laser beam can be applied through the electrostatic chuck table to the workpiece in the condition where the back side of the workpiece is held on the second surface of the base portion, in which a metal layer and devices are not formed on the back side of the workpiece. That is, it is unnecessary to hold the front side of the workpiece where the metal layer and the devices are formed, so that there is no possibility that the devices each having surface asperities may be damaged. Further, it is unnecessary to provide a special design on the front side of the workpiece or to previously remove a TEG pattern from the front side of the workpiece. Accordingly, any limit in processing the workpiece by using the electrostatic chuck table can be suppressed.

The present invention is not limited to the above preferred embodiment, but various modifications may be made without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An electrostatic chuck table using method for using an electrostatic chuck table including:
   a plate-shaped base portion capable of transmitting a laser beam therethough to a workpiece, said laser beam having a transmission wavelength with respect to said workpiece, said base portion having a first surface and a second surface opposite to said first surface, and
   an electrostatic attraction electrode portion capable of transmitting said laser beam therethrough, said electrode portion being formed on said first surface of said base portion,
   said electrostatic chuck table using method comprising:
   a workpiece holding step of applying a voltage to said electrode portion formed on said first surface to thereby electrostatically hold said workpiece on said second surface; and
   a modified layer forming step of applying said laser beam through said first surface to a predetermined position inside said workpiece held on said second surface to thereby form a modified layer inside said workpiece while said workpiece is electrostatically held on said second surface.

2. The electrostatic chuck table using method according to claim 1, wherein the transmission wavelength of said laser beam is set in the range of 500 to 1400 nm.

3. The electrostatic chuck table using method according to claim 1, wherein said workpiece includes a wafer having a front side where MEMS devices are formed and a back side to be held on said second surface of said electrostatic chuck table.

4. The electrostatic chuck table using method according to claim 1, wherein during the modified layer forming step, the laser beam passes through said base portion of said electrostatic chuck table before passing into said workpiece.

5. The electrostatic chuck table using method according to claim 1, wherein said workpiece includes a front side with a plurality of devices thereon and a back side that is opposite of the front side, and further wherein the back side of the workpiece faces the second surface of the base portion of the electrostatic chuck table during the modified layer forming step.

\* \* \* \* \*